United States Patent
Cho et al.

(10) Patent No.: US 7,332,774 B2
(45) Date of Patent: Feb. 19, 2008

(54) MULTIPLE-GATE MOS TRANSISTOR AND A METHOD OF MANUFACTURING THE SAME

(75) Inventors: Young Kyun Cho, Daejeon-shi (KR); Sung Ku Kwon, Daejeon-shi (KR); Tae Moon Roh, Daejeon-shi (KR); Dae Woo Lee, Daejeon-shi (KR); Jong Dae Kim, Daejeon-shi (KR)

(73) Assignee: Electronics and Telecommunications Research Institute, Daejeon-Shi (KR)

( * ) Notice: Subject to any disclaimer, the term of this patent is extended or adjusted under 35 U.S.C. 154(b) by 0 days.

(21) Appl. No.: 11/727,268

(22) Filed: Mar. 26, 2007

(65) Prior Publication Data

US 2007/0190709 A1    Aug. 16, 2007

Related U.S. Application Data

(62) Division of application No. 10/989,006, filed on Nov. 16, 2004, now Pat. No. 7,208,356.

(30) Foreign Application Priority Data

May 25, 2004    (KR) ............................... 2004-37571

(51) Int. Cl.
*H01L 29/76* (2006.01)
*H01L 29/94* (2006.01)

(52) U.S. Cl. ............... 257/338; 257/369; 257/E27.117; 257/E27.06

(58) Field of Classification Search ................ 257/338, 257/347, 351–352, 368–369, E27.112, E27.006
See application file for complete search history.

(56) References Cited

U.S. PATENT DOCUMENTS 6,342,410 B1    1/2002    Yu (Continued)

FOREIGN PATENT DOCUMENTS

KR    2002-0096654    12/2002

(Continued)

OTHER PUBLICATIONS

Kedzierski et al.; "Extension and Source/Drain Design for High-Performance FinFET Devices"; 0018-9383/03$17.00; IEEE 2003; pp. 952-958.

(Continued)

*Primary Examiner*—Thanhha S. Pham
(74) *Attorney, Agent, or Firm*—Lowe Hauptman Ham & Berner LLP

(57)    ABSTRACT

Provided is a multiple-gate metal oxide semiconductor (MOS) transistor and a method for manufacturing the same, in which a channel is implemented in a streamline shape, an expansion region is implemented in a gradually increased form, and source and drain regions is implemented in an elevated structure by using a difference of a thermal oxidation rate depending on a crystal orientation of silicon and a geographical shape of the single-crystal silicon pattern. As the channel is formed in a streamline shape, it is possible to prevent the degradation of reliability due to concentration of an electric field and current driving capability by the gate voltage is improved because the upper portion and both sides of the channel are surrounded by the gate electrodes. In addition, a current crowding effect is prevented due to the expansion region increased in size and source and drain series resistance is reduced by elevated source and drain structures, thereby increasing the current driving capability.

4 Claims, 11 Drawing Sheets

U.S. PATENT DOCUMENTS

| | | | |
|---|---|---|---|
| 6,413,802 | B1 | 7/2002 | Hu et al. |
| 6,495,403 | B1 | 12/2002 | Skotnicki et al. |
| 6,562,665 | B1 | 5/2003 | Yu |
| 7,122,412 | B2 * | 10/2006 | Chen et al. ............ 438/157 |

FOREIGN PATENT DOCUMENTS

| | | |
|---|---|---|
| KR | 2003-0065631 | 8/2003 |
| KR | 10-0420070 | 2/2004 |

OTHER PUBLICATIONS

Park et al.; "Pi-gate SOI MOSFET"; 0741-3106/01$10.00; IEEE 2001; pp. 405-406.

Yang et al.; "35nm CMOS FinFETs"; 0-7803-7312-X/02/$17.00; 2 pages, IEEE2002.

Chau et al.: "Advanced Depleted-Substrate Transistors: Single-gate, Double-gate and Tri-gate (Invited Paper)", 2001; 2 pages.

Fu-Liang Yang et al.; "25nm CMOS Omega FETs"; 0-7803-X/02/$17.00; IEEE; 2002; 5 pages.

Choi et al.; "Sub-20nm CMOS FinFET Technologies"; 0-7803-7050-3/01/$10.00; IEEE; 2001; pp. 421-424.

Hisamoto et al.; "A Folded-channel MOSFET for Deep-sub-tenth Micron Era", IEDM 98; pp. 1032-1034.

Huang et al.; "Sub 50-nm FinFET: PMOS"; IEDM 99; pp. 67-70.

Yu et al.; "FinFET Scaling to 10nm gate Length"; 0-7803-7463-X/02/$17.00; IEEE; 2002.

Hisamoto et al.; "A Folded-channel MOSFET for Deep-sub-tenth Micron Era"; IEDM 98; pp. 1032-1034, 1998.

Huang et al.; "Sub 50-nm FinFET: PMOS"; IEDM 99; pp. 67-70, 1999.

* cited by examiner

MULTIPLE-GATE MOS TRANSISTOR AND A METHOD OF MANUFACTURING THE SAME

CROSS REFERENCE TO RELATED APPLICATION

This application is a divisional of U.S. Ser. No. 10/989,006, filed on Nov. 16, 2004 now U.S. Pat. No. 7,208,356. This application, in its entirety, is incorporated herein by reference.

BACKGROUND

1. Field of the Invention

The present invention relates generally to a multiple-gate metal oxide semiconductor (MOS) transistor and a method of manufacturing the same, and more particularly to a multiple-gate MOS transistor having a channel in a form of a streamline (∩), and a source and a drain in which a series resistance is reduced, and a method of manufacturing the same.

2. Discussion of Related Art

As technology for manufacturing a semiconductor device is developed, many efforts have been made to improve performance of the semiconductor device through a decrease in size, an increase in operating speed, and so on. Hence, in the case of a metal-oxide-semiconductor field-effect transistor (MOSFET) which has constituted the principal axis of devices used in the electronic field today, the size decrease (scale down) has been continued. However, when a length of a channel decreases to 100 nm or less, the MOSFET is generally lowered in ON/OFF control capability depending on a gate voltage due to a so-called short channel effect.

In order to overcome the problem, there has been a proposal for a dual-gate structure where gate electrodes are formed on both sides of the channel through which an electric current flows. Since the gate electrodes are formed on the both sides of channel in the dual-gate structure, the capability of controlling the electric current in the channel is significantly improved by means of the gate voltage. Thus, the short channel effect is suppressed, so that it is possible to more reduce the size of the device. In addition, there has been a proposal for either a "wrap-around" gate structure or a "surround" gate structure which expands a concept of the dual-gate structure. In these gate structures, the control capability depending on the gate voltage could be improved.

In the FET of the ideal dual-gate structure, the front side and back side gates are self-aligned and source and drain are also self-aligned, and thus a parasitic resistance becomes small. Recently, a FinFET of the dual-gate structure has been developed, which has a self-aligned gate while applying the existing semiconductor process as it is. It has an advantage of the high compatibility with the existing planar structure semiconductor technologies.

FIG. 1 is a perspective view for explaining a conventional dual-gate FinFET.

A silicon on insulator (SOI) substrate on which a silicon layer 10, an oxide layer 11, and a single-crystal silicon layer 12 are laminated is used. Source and drain regions 12a, a channel region 12b, and an expansion region 12c are defined by a single-crystal silicon pattern 12 which is formed by patterning the single-crystal silicon layer 12 and has a fin structure. The channel region 12b and the expansion region 12c between the source and drain regions 12a are formed to be narrower than the source and drain regions 12a.

A mask pattern 13 for preventing concentration of an electric field and formation of a channel is formed on the single-crystal pattern 12 of the channel region 12b, and a gate oxide layer 14 is formed on the single-crystal silicon pattern 12, and a gate electrode 15 is formed on the gate oxide layer 14 and an oxide layer 11 of the channel region 12b.

However, the dual-gate FinFET configured as mentioned above has the following disadvantages.

First, in order to manufacture the FinFET in which a gate length is about 60 nm and an operating characteristic is stabilized, the channel region should be formed to a width of about 40 nm or less. But, in order to form the channel with a fine size, nano-patterning technology is required, and thus precise lithography technology is required. When general electronic beam lithography technology is used, the characteristic deviation of the device may be relatively increased because the change of the width of the channel region becomes relatively increased.

Second, when forming the fin having the single crystal silicon pattern as mentioned above, it is difficult to form the pattern to be thin and high and the fin of the channel region is formed in a rectangular shape. For these reasons, there occurs a corner effect in which electrons are accumulated by local concentration of the electric field at an upper end edge, and thus the reliability of the device becomes lowered.

Finally, since the source and drain expansion region is formed to the same thickness as the channel region, a parasitic resistance becomes higher, and thus the electric current driving capability of the device is significantly decreased. In order to solve these problems, an attempt has been made to apply elevated source and drain structures in which single-crystal silicon or silicon germanium (SiGe) is epitaxially grown in source and drain regions. However, this attempt has a problem of making its process complicated.

SUMMARY OF THE INVENTION

Therefore, in order to overcome the problems, the present invention is directed to a multiple-gate MOS transistor and method for manufacturing the same, capable of preventing degradation of reliability due to concentration of an electric field by forming a channel structure in a streamline form using a difference between thermal oxidation rates based on a form of a single-crystal silicon pattern and a crystal orientation of silicon.

The present invention is also directed to a multiple-gate MOS transistor and method for manufacturing the same, capable of improving current driving capability of a device by changing a structure of the source and drain expansion region to reduce a parasitic resistance.

The present invention is also directed to a multiple-gate MOS transistor and method for manufacturing the same, capable of simplifying processes and improving characteristics of a device by forming elevated source and drain structures in a relatively simple way.

An aspect of the present invention is to provide a multiple-gate metal oxide semiconductor (MOS) transistor, comprising: a substrate formed of an insulating layer thereon; a single-crystal silicon pattern formed on the insulating layer and providing source and drain regions, a channel region formed between the source and drain regions, and an expansion region interconnecting the source and drain regions with the channel region; a gate insulating layer formed on the single-crystal silicon pattern of the channel region; and a gate electrode formed on the gate insulating layer of the channel region, wherein an upper portion of the single-crystal silicon pattern of the channel region has a streamline shape, and wherein a size of the single-crystal silicon pattern of the expansion region is gradually increased toward the source and drain regions.

Another aspect of the present invention is to provide a method of manufacturing a multiple-gate metal oxide semiconductor (MOS) transistor, the method comprising: forming a single-crystal silicon pattern providing source and drain regions, a channel region formed between the source and drain regions, and an expansion region interconnecting the source and drain regions with the channel region on an insulating layer; forming a silicon oxide layer and a nitride layer on the single-crystal silicon pattern; patterning the nitride layer to expose the silicon oxide layer that exists in parts of the channel region and the expansion region; forming an oxide layer taking a form of a field oxide layer having a bird's beak in the channel region and the expansion region; removing the exposed oxide layer of the channel region and the expansion region; forming a gate insulating layer on an exposed single-crystal silicon pattern of the channel region; forming a gate electrode on the gate insulating layer; and implanting impurity ions into the single-crystal silicon patterns of the source and drain regions.

The single-crystal silicon pattern of the source and drain regions has a thickness larger than that of the single-crystal silicon pattern of the channel region and the expansion region.

The gate electrode is formed to partially overlap the expansion region.

The silicon oxide layers having different thicknesses from each other are formed on the upper portion and the both sides of the single-crystal silicon pattern.

The oxide layer taking the form of the field oxide layer is formed by a thermal oxidation process, and the thermal oxidation process is carried out by a wet etching method or wet and dry etching methods.

The upper portion of the single-crystal silicon pattern of the channel region has a streamline shape, and the size of the single-crystal silicon pattern of the expansion region is gradually increased toward the source and drain regions by forming the oxide layer.

The form of streamline is formed by a difference of the thermal oxidation rate depending on a crystal orientation of single-crystal silicon.

BRIEF DESCRIPTION OF THE DRAWINGS

The foregoing and other objects, features and advantages of the invention will be apparent from the more particular description of a preferred embodiment of the invention, as illustrated in the accompanying drawing. The drawing is not necessarily to scale, emphasis instead being placed upon illustrating the principles of the invention.

FIG. 2b is a perspective view of the single-crystal silicon pattern in FIG. 2a.

FIGS. 3b, 4b, 5b . . . 10b and 11b are cross-sectional views taken along the line B1-B2 of FIGS. 3a, 4a, 5a . . . 10a and 11a.

FIGS. 3c, 4c, 5c . . . 10c and 11c are cross-sectional views taken along the line C1-C2 of FIGS. 3a, 4a, 5a . . . 10a and 11a.

DETAILED DESCRIPTION OF PREFERRED EMBODIMENTS

Hereinafter, the preferred embodiments of the present invention will be explained with reference to the accompanying drawings.

Figure 1:
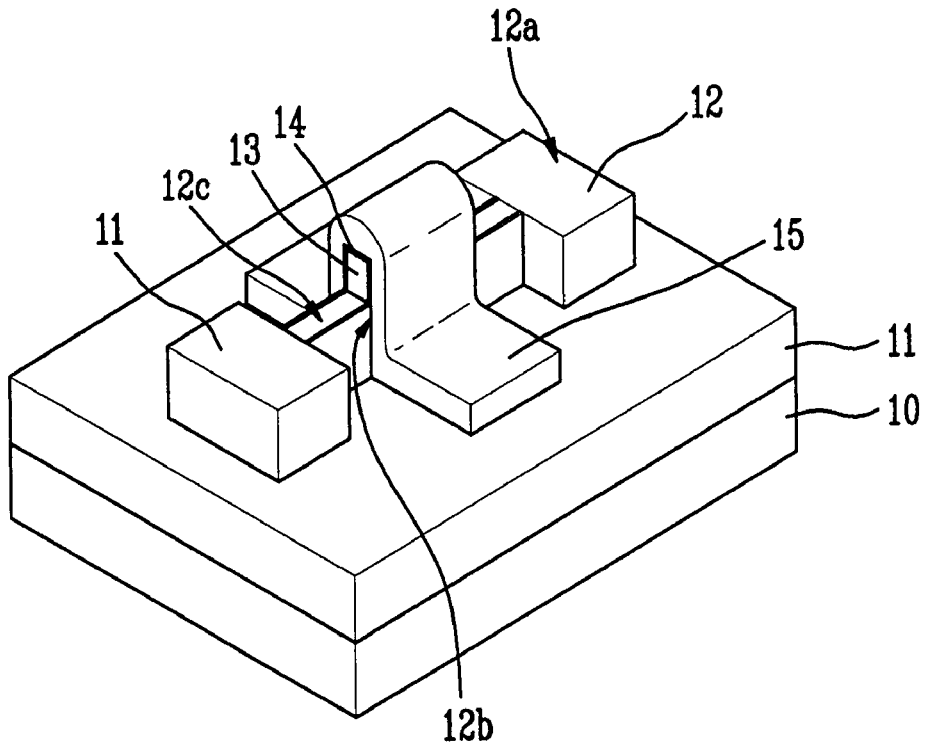
FIG. 1 is a perspective view for explaining a conventional dual-gate FinFET.
Figure 2A:
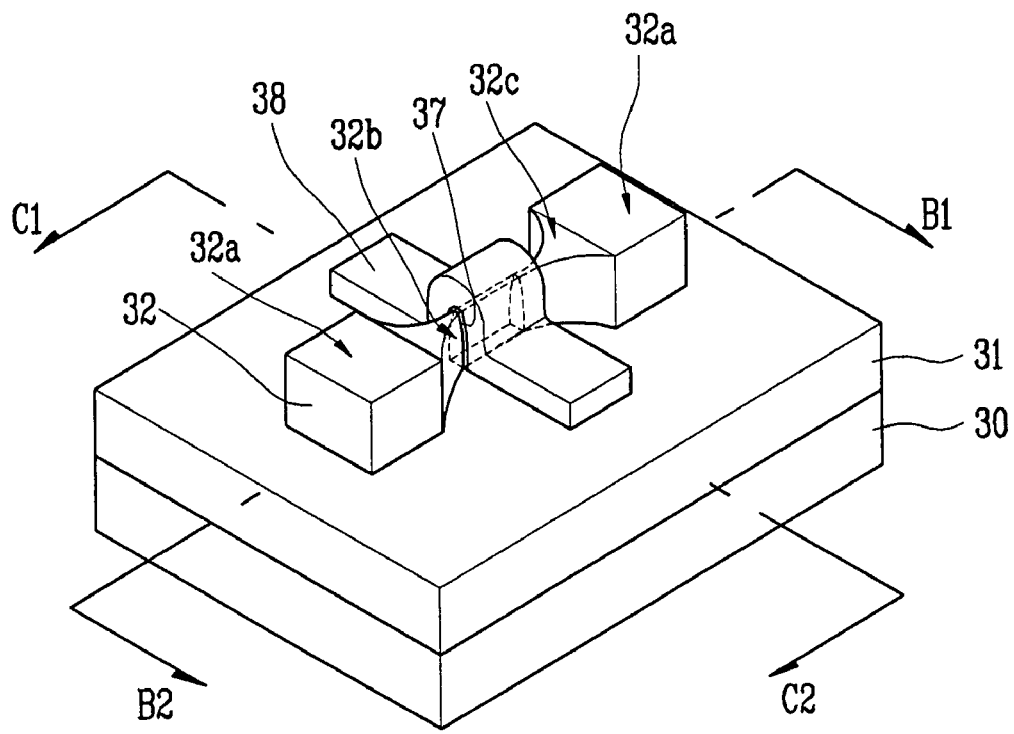
FIG. 2a is a perspective view for explaining a multiple-gate MOSFET according to an embodiment of the present invention.
Figure 2B:
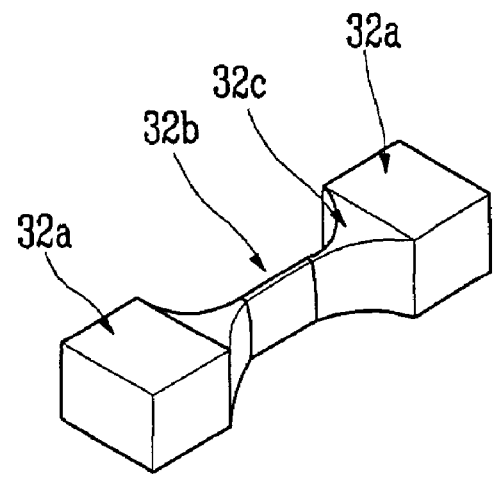

FIG. 2a is a perspective view for explaining a multiple-gate metal oxide semiconductor field effect transistor (MOSFET) according to one embodiment of the present invention, and FIG. 2b is a perspective view showing only the single-crystal silicon pattern of FIG. 2a.

A silicon on insulator (SOI) substrate is used, on which a silicon layer 30, an oxide layer 31, and a single-crystal layer 32 are laminated. The single-crystal silicon pattern 32 is formed by patterning the single-crystal silicon layer 32. The single-crystal silicon pattern 32 is allowed to define source and drain regions 32a, a channel region 32b formed between the source and drain regions 32a, and an extension region 32c interconnecting the source and drain regions 32a with the channel region 32b (see FIG. 2a).

The single-crystal silicon pattern 32 of the channel region 32b is formed to have a streamline form at its upper portion. The single-crystal silicon pattern 32 of the expansion region 32c is formed so that its surface area is gradually increased in proportion to the approach of the source and drain regions 32a. The single-crystal silicon pattern 32 of the source and drain regions 32a is formed to be thicker and wider than that of the channel and expansion regions 32b and 32c (see FIG. 2b).

A gate insulating layer 37 is formed on the single-crystal silicon pattern 32 of the channel region 32b, and a gate electrode 38 is formed on a gate insulating layer 33 of the channel region 32b. In this case, the gate electrode 38 may be formed to partially overlap the expansion region 32c, and also it may be formed to extend to an upper portion of the insulating layer 31 (see FIG. 2a).

The multiple-gate MOSFET of the present invention constructed as mentioned above may be manufactured by the following processes.

Figure 3A:
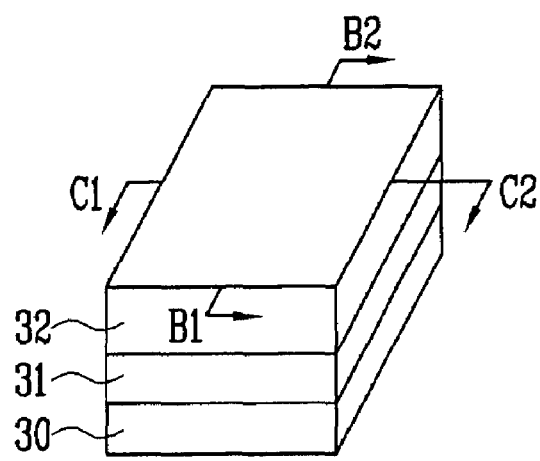
FIGS. 3a, 4a, 5a . . . 10a and 11a are perspective views for explaining a method for manufacturing a multiple-gate MOSFET according to an embodiment of the present invention.
Figure 3B:
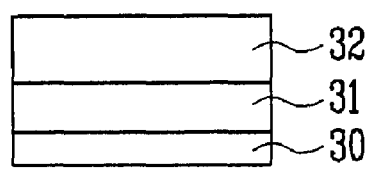
Figure 3C:
Figure 4A:
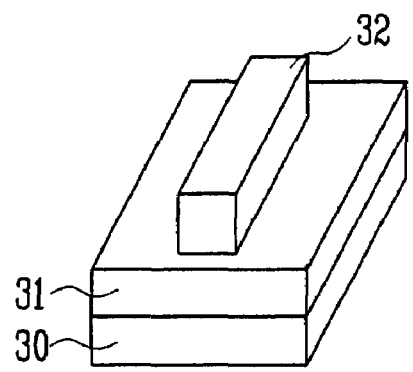
Figure 4B:
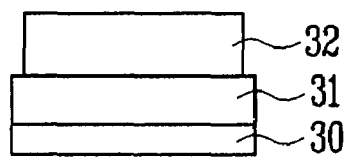
Figure 4C:
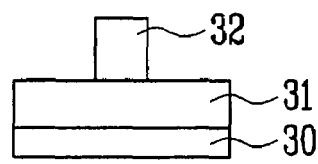
Figure 5A:
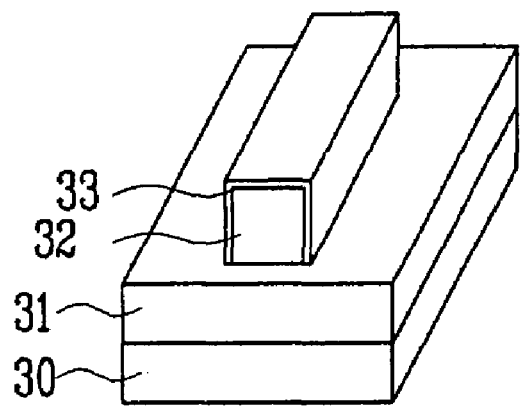
Figure 5B:
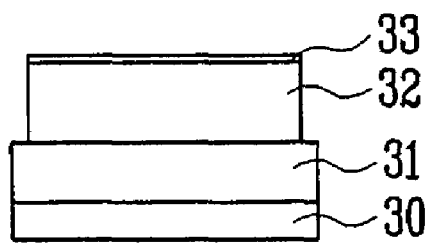
Figure 5C:
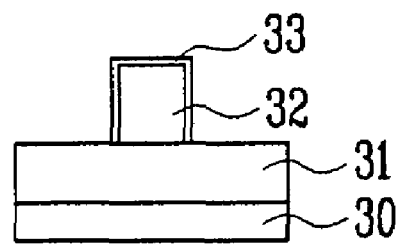

FIGS. 3a, 4a, 5a . . . 10a and 11a are perspective views showing the entire structure, FIGS. 3b, 4b, 5b . . . 10b and 11b are cross-sectional views taken along the line B1-B2 of FIGS. 3a, 4a, 5a . . . 10a and 11a, and FIGS. 3c, 4c, 5c . . . 10c and 11c are cross-sectional views taken along the line C1-C2 of FIGS. 3a, 4a, 5a . . . 10a and 11a.

Referring to FIG. 3a through FIG. 3c, a silicon on insulator (SOI) substrate is provided, on which a silicon layer 30, an oxide layer 31 and a single-crystal layer 32 are laminated.

Referring to FIG. 4a through FIG. 4c, the single-crystal silicon layer 32 of the silicon on insulator (SOI) substrate having a (100) surface orientation is patterned by photolithography and etching processes, and keep the single-crystal silicon pattern 32 of a fin structure to remain in an device forming region (active region).

In the general fin structure, the active region is formed to have a size of several tens of nanometers, but the active region according to the present invention may be formed to have a size of several hundreds of nanometers. If the single-crystal silicon pattern 32 is formed larger, it is possible to increase the size of the source and drain expansion region, thereby helping in reducing the source and drain series resistance. However, if the source and drain expansion region is formed too large, it is difficult to make the channel structure thin and uniform by a thermal oxidation process.

According to the present embodiment, when forming the single-crystal silicon pattern 32, width and height of the single-crystal silicon pattern 32 may be controlled, thereby adjusting geometry of the channel which is to be formed.

Referring to FIG. 5a through FIG. 5c, a silicon oxide ($SiO_2$) layer 33 is formed on the single-crystal silicon pattern 32. In this case, such a silicon oxide layer is also formed on the oxide layer 31, but is not shown in figures because its thickness is so small that it may be disregarded. The silicon oxide layer 33 may be formed by a chemical vapor deposition (CVD) method or an atomic layer deposition (ALD) method.

Here, in order to achieve various channel structures upon forming the silicon oxide layer 33, the silicon oxide layers 33 having different thicknesses from each other may be formed on the upper portion and the both sides of the single-crystal silicon pattern 32. Furthermore, a nitride layer (not shown) may be formed on the respective sides of the single-crystal silicon pattern 32, thereby suppressing thermal oxidation in the lower portions of the both sides.

Figure 6A:
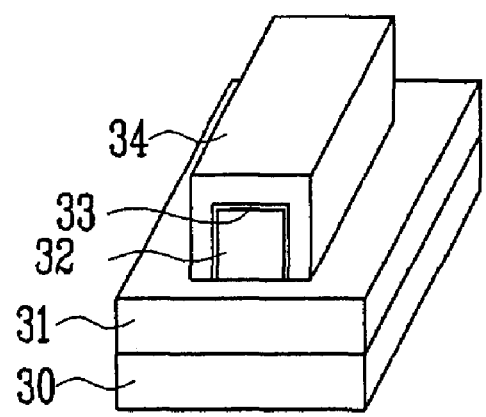
Figure 6B:
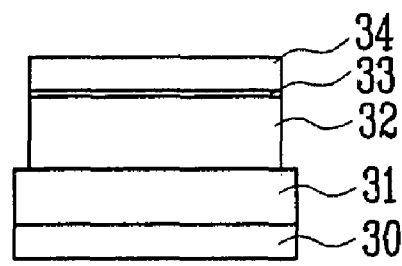
Figure 6C:
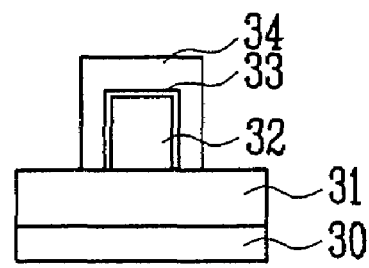

Referring to FIG. 6a through FIG. 6c, a nitride layer ($Si_3N_4$) 34 of a predetermined thickness is formed on the silicon oxide layer 33. The nitride layer 34 may be formed by a chemical vapor deposition (CVD) method or an atomic layer deposition (ALD) method.

Meanwhile, according to another embodiment, the nitride layer 34 may be directly formed on the surface of the single-crystal silicon pattern 32 without forming the silicon oxide layer 33.

Figure 7A:
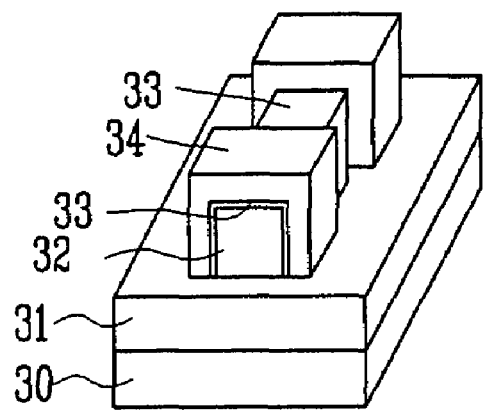
Figure 7B:
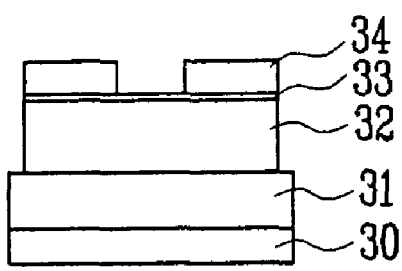
Figure 7C:
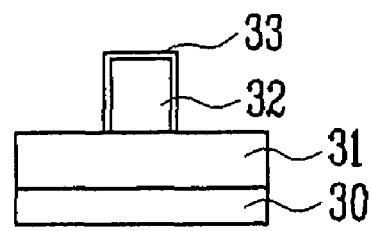

Referring to FIG. 7a through FIG. 7c, the nitride layer 34 is patterned so that the silicon oxide layer 33 that exists in parts of the channel region and the expansion region may be exposed by the photolithography and etching processes using a predetermined mask. In this case, the length of a gate to be formed is found by the following formula "the length of the nitride layer which is to be removed—(2×the thickness of a low-k spacer)]. Thus, in consideration of this relation, the nitride layer 34 is patterned.

Figure 8A:
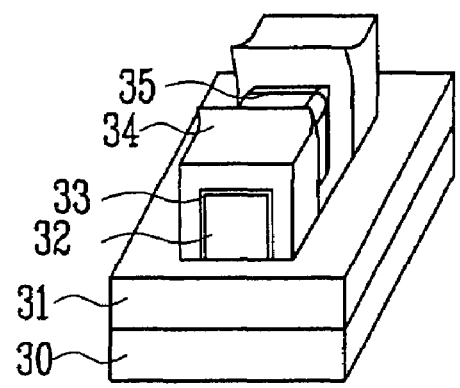
Figure 8B:
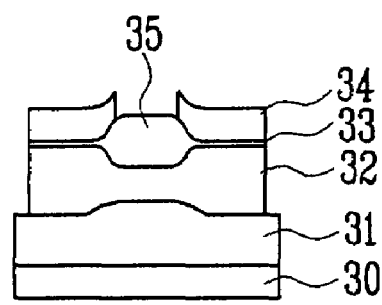
Figure 8C:
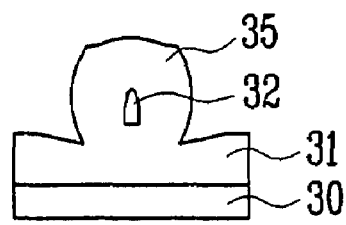

Referring to FIG. 8a through FIG. 8c, the exposed portion of the silicon oxide layer 33 is subjected to thermal oxidation, and thus a thermal oxide layer 35 is formed. The thermal oxide layer 35 is grown by a wet thermal oxidation process at a high temperature of 900° C. or more. However, in order to improve the characteristics of an interface between the silicon single-crystal pattern 32 and the thermal oxide layer 35, a dry thermal oxidation process and a wet thermal oxidation process may be sequentially carried out.

Figure 12A:
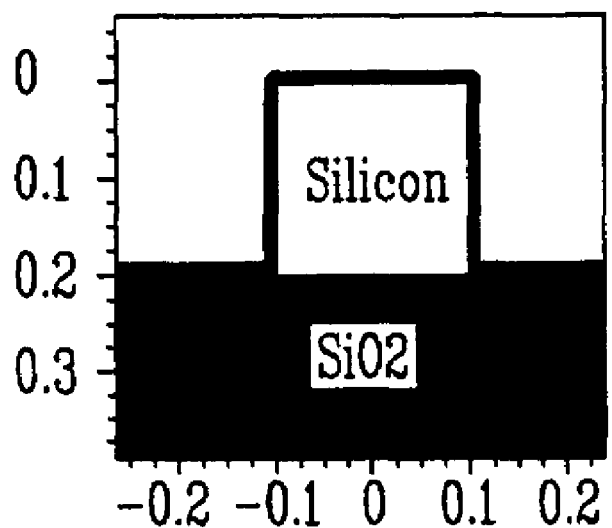
FIGS. 12a and 12b show results performing two-dimensional simulation with respect to a process of forming a channel region of the present invention.
Figure 12B:
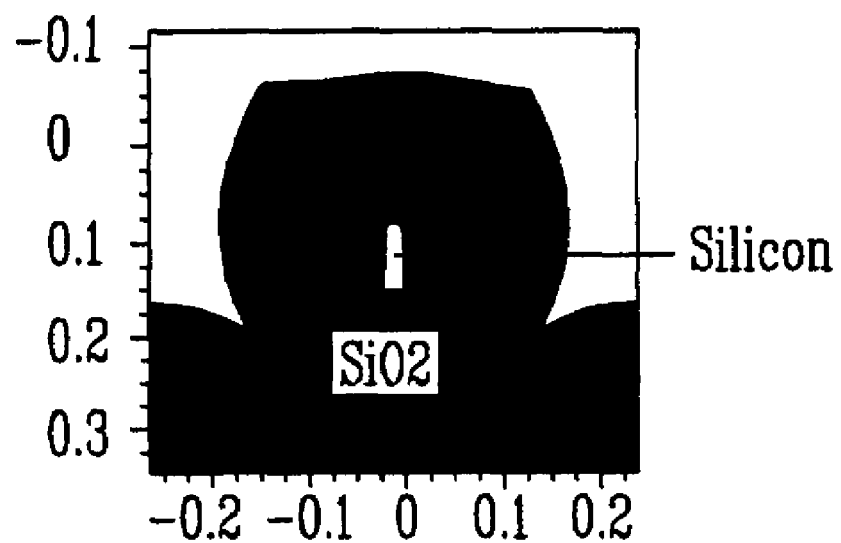

Unlike the oxide layer, the nitride layer does not allow oxygen or vapor to pass through. Therefore, the thermal oxide layer 35 is grown at only a portion where the nitride layer 34 is not formed, i.e. portions of the channel region and the expansion region. In this case, a portion of the thermal oxide layer 35, about 45%, is grown to the lower portion of the nitride layer 34 due to a density difference between the thermal oxide layer 35 and the silicon single-crystal pattern 32, as shown in FIG. 8b. Thus, as a thermal oxide layer 35 in a type of a field oxide layer with a Bird's beak is formed, the single-crystal silicon pattern 32 is transformed to a form of a dog bone. In addition, an oxide layer 31 of the interface of the thermal oxide layer 35 is also grown in a C1-C2 direction, as shown in FIG. 8b and FIG. 8c, due to permeation through the interface of the oxide layer 31 during the thermal oxidation. For reference, FIG. 12a illustrates the state of the FIG. 7c after two-dimensional simulation, and FIG. 12b illustrates the state of FIG. 7c after two-dimensional simulation, and specifically the state in which the channel region is formed as shown in FIG. 8c after the thermal oxidation.

Meanwhile, when the thickness of the silicon oxide layer 33 is very small and the thickness of the nitride layer 34 is very large, the silicon oxide layer 33 may be removed in spite of high etch selectivity of the nitride layer 34 and the silicon oxide layer 33. In this case, the problem of removal of the silicon oxide layer 33 may be solved by carrying out the wet oxidation process after re-growing the silicon oxide layer by a chemical vapor deposition (CVD) method or an atomic layer deposition (ALD) method.

Figure 9A:
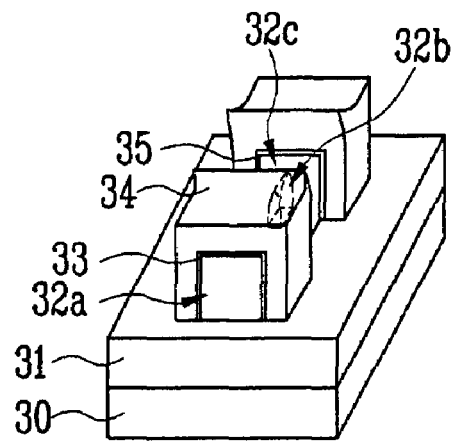
Figure 9B:
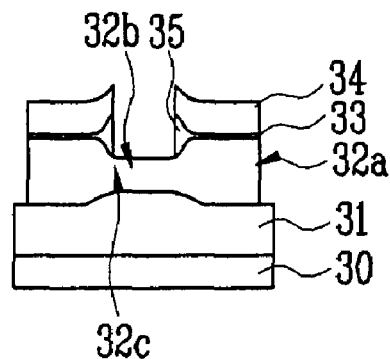
Figure 9C:
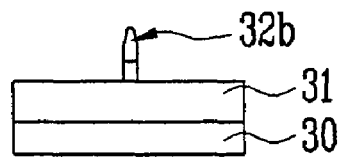

Referring to FIG. 9a through FIG. 9c, the exposed portion of the thermal oxide layer 35 is removed by an etching process using the nitride layer 34 as a mask.

If the dry etching method is used to remove the thermal oxide layer 35, the thermal oxide layer 35 that is grown in the lower portion of the single-crystal silicon pattern 32 of the channel region is not removed, and only the thermal oxide layer 35 of the upper portion and both sides in the single-crystal silicon pattern 32 of the channel region may be removed. Thereby, it is possible to manufacture the multiple-gate MOSFET using the upper portion and both sides of the channel.

On the other hand, if the wet etching method is used, the single-crystal silicon pattern 32 of the channel region will be etched in a manner that surroundings (up, down, left and right) of the pattern are etched without any residues. This type of structure may be applied to a device such as a "surround-gate transistor."

As the thermal oxide layer 35 that exists in parts of the expansion region and the channel is removed, the single-crystal silicon pattern 32 remains as shown in FIG. 2b. That is, the upper portion of the channel region 32b has a narrow width and a streamline shape. The expansion region 32c is formed so that the width and height (size) are gradually increased toward the source and drain regions 32a. And the source and drain regions 32a have elevated source and drain structures thicker than the channel region 32b and the expansion region 32c.

Because, the thermal oxide layer 35 may be grown in only the surface of the silicon oxide layer 33 that is exposed in the above-mentioned oxidation process and it is not grown in the lower portion of the nitride layer 34, the width and height of the single-crystal silicon pattern 32 in the channel region are gradually increased toward the source and drain regions 32a. For this reason, the elevated source and drain structures are at least twice as thick as the channel region, so that the parasitic resistance in the source and drain region may be effectively reduced, and that a current crowding effect in the drain region may be prevented by the region where the width is gradually increased.

According to the present invention, it is possible to make the thin and elevated channel region 32b in the streamline shape by the thermal oxidation, and to implement the self elevated source and drain structures.

The channel region 32b may be implemented in a streamline shape, a trapezoidal shape where an upper width is narrower than a lower width, or other shapes.

For example, in order to minutely adjust the channel thickness, a growth rate difference of the silicon oxide layer based on the crystal orientation of the single-crystal silicon may be used. In case of using the silicon on insulator (SOI) substrate with the (100) surface orientation, the upper portion of the single-crystal silicon pattern may be subjected to thermal oxidation at a relatively lower speed than that of the lateral silicon with the (100) surface orientation because it has the (100) surface orientation. Therefore, thinner Fin structure may be formed because relatively thicker silicon oxide layer is grown on both sides of the channel having the (100) crystal orientation.

Furthermore, the upper portion of the single-crystal silicon pattern may be made in a streamline shape by overlapping the thermal oxide layers, because the thermal oxide layers is grown on the sides and the upper portion of the single-crystal silicon pattern of the channel region during the thermal oxidation. When the upper portion is formed in a streamline shape, no edge is formed. Thus, the concentration of the electric field may be prevented, so that the corner effect caused by the electron accumulation may be avoided, and thus the reliability and durability of the device become improved. The process of the present invention as above-mentioned does not allow the single-crystal silicon pattern of the channel region that is physically stable to be collapsed.

Figure 10A:
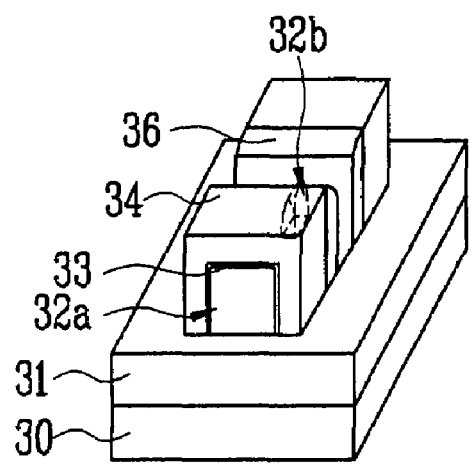
Figure 10B:
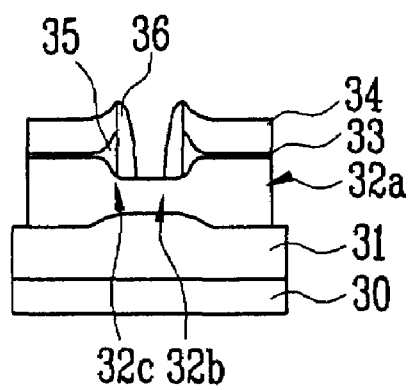
Figure 10C:
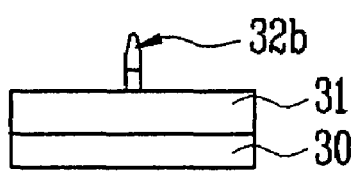

Referring to FIG. 10a through FIG. 10c, after forming an insulating layer 36 on the entire surface, an insulating layer spacer 36 is formed on lateral walls of the nitride layer 34 and the thermal oxide layer 35 by etching the insulating layer 36. The insulating layer 36 is formed by depositing an insulating material which has a low dielectric constant (low-k) and a good etch selectivity using a chemical vapor deposition (CVD) method or a atomic layer deposition (ALD) method. The insulating layer spacer 36 for defining a gate is progressed by a dry etching process. In this case, the thickness of the insulating layer spacer 36 may be adjusted by the thickness of the nitride layer 34. For example, if the insulating spacer 36 is formed thicker, short gates may be formed by a self-alignment method, but the length of the source and drain expansion region becomes longer, thus the source and drain series resistance becomes increased. Therefore, in order to make the gate and the expansion region appropriate in length, it is important to select the thickness of the nitride layer 34.

Figure 11A:
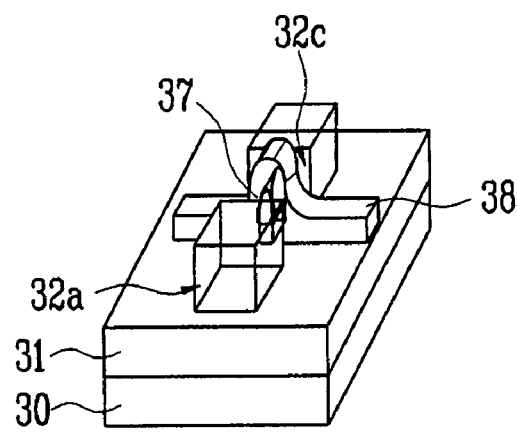
Figure 11B:
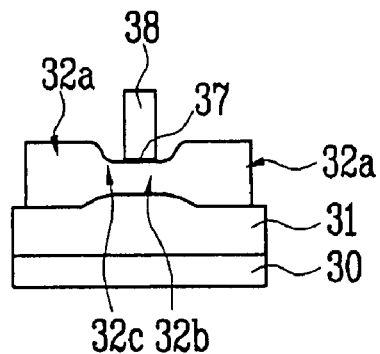
Figure 11C:
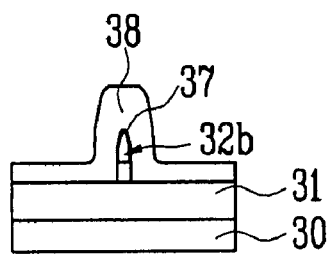

Referring to FIG. 11a through FIG. 11c, a gate insulating layer 37 is formed on the single-crystal silicon pattern 32 in the channel region 32b. In this case, the gate insulating layer 37 is grown on the surface of the oxide layer 31, but is not shown in figures because the thickness of the silicon oxide layer is so small that it may be disregarded. The lateral walls of the single-crystal silicon pattern 32 in the channel region 32b are cleaned before forming the gate insulating layer 37, and in order to remove any damage caused by former processes, it is preferable to form a sacrificial oxide and remove it, and then perform annealing it in a nitrogen or argon atmosphere.

A silicon oxide layer, a nitride layer or an insulating layer having a high dielectric constant (high-k) may be used as the gate insulating layer 37.

Then, if a conductive layer is formed of a positive type (P-type)/negative type (N-type) polysilicon, or a P-type/N-type silicon germanium (SiGe) or metal, etc., on the entire surface, the shape of the gate self-aligned by the insulating layer spacer 36 is made. And then, the conductive layer is patterned by a nano-patterning process using a photolithography method, thereby forming a gate electrode 38, and the remained insulating layer spacer 36, the nitride layer 34 and the silicon oxide layer 33 are removed.

Finally, impurity ions of a high concentration are implanted into the single-crystal silicon pattern 32 of the source and drain regions 32a to form a source and a drain, so that a multiple-gate electric field effect transistor may be completed.

It is possible to minimize the overlapping portion between the gate and the source and the drain by forming a spacer on the gate sidewall of the gate electrode 38 before implanting impurity ions, and it is preferable to perform an annealing process for activating the dopant after implanting the impurity ions.

As mentioned above, the present invention allows the channel where the upper portion is formed in the streamline shape to be easily formed by adjusting the width and height of the channel using the differences of the thermal oxidation rates depending on the crystal orientation of the silicon and the geographical shape of the single-crystal silicon pattern. The streamline shape of the channel enables the degradation of reliability due to concentration of an electric effect to be prevented, and current driving capability by the gate voltage is improved because the upper portion and both sides of the channel are surrounded by the gate electrodes.

In addition, the multiple-gate MOS transistor of the present invention is formed in a structure where the source and drain expansion region is gradually increased, so that the current crowding effect may be prevented, and it is formed to have source and drain structures where the source and drain regions are elevated by the thermal oxidation process, so that the current driving capability may be increased by reducing the series resistance of the source and drain.

Conventionally, a separate expitaxial layer forming process was required in order to make the elevated source and drain structures, but the present invention allows the elevated source and drain structures to be easily implemented without requiring any additional process, and lithography technology having a high difficulty in gate-patterning is not required by forming the gate electrode by the self-alignment method.

While the communication system using a near field and a method thereof have been described with reference to exemplary embodiments, these embodiments are illustrative only, but not for limiting the scope of the present invention claimed in the following claims. Therefore, those skilled in the art will appreciate that a variety of modifications and the equivalents thereof can be made. Thus, the scope of the present invention should be defined by the appended claims.

What is claimed is:

1. A multiple-gate metal oxide semiconductor (MOS) transistor, comprising:
    a substrate formed of an insulating layer thereon;
    a single-crystal silicon pattern formed on the insulating layer and providing source and drain regions, a channel region formed between the source and drain regions, and an expansion region interconnecting the source and drain regions with the channel region;
    a gate insulating layer formed on the single-crystal silicon pattern of the channel region; and
    a gate electrode formed on the gate insulating layer of the channel region,
    wherein the single-crystal silicon pattern of the channel region has an upper portion defining a smooth curve; and
    a height and width of the single-crystal silicon pattern of the expansion region is gradually increased toward the source and drain regions.

2. The multiple-gate MOS transistor as recited in claim 1, wherein the single-crystal silicon pattern of the source and drain regions has a thickness larger than that of the single-crystal silicon pattern of the channel region and the expansion region.

3. The multiple-gate MOS transistor as recited in claim 1, wherein the gate electrode is formed to partially overlap the expansion region.

4. The multiple-gate MOS transistor as recited in claim 1, wherein the gate electrode is formed to extend to an upper portion of the insulating layer.

* * * * *